United States Patent
Sorloaica-Hickman et al.

(10) Patent No.: US 10,446,733 B2
(45) Date of Patent: Oct. 15, 2019

(54) HYBRID SOLAR CELL

(71) Applicant: University of Central Florida Research Foundation, Inc., Orlando, FL (US)

(72) Inventors: Nicoleta Sorloaica-Hickman, Orlando, FL (US); Robert Martin Reedy, Auburndale, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 603 days.

(21) Appl. No.: 14/977,156

(22) Filed: Dec. 21, 2015

(65) Prior Publication Data

US 2016/0190371 A1 Jun. 30, 2016

Related U.S. Application Data

(60) Continuation-in-part of application No. 13/861,594, filed on Apr. 12, 2013, now abandoned, which is a division of application No. 12/243,431, filed on Oct. 1, 2008, now Pat. No. 8,420,926.

(60) Provisional application No. 60/976,987, filed on Oct. 2, 2007.

(51) Int. Cl.
*H01L 35/28* (2006.01)
*H01L 31/0224* (2006.01)
(Continued)

(52) U.S. Cl.
CPC ............ *H01L 35/28* (2013.01); *H01L 31/024* (2013.01); *H01L 31/022425* (2013.01);
(Continued)

(58) Field of Classification Search
None
See application file for complete search history.

(56) References Cited

U.S. PATENT DOCUMENTS 4,609,770 A * 9/1986 Nishiura ........... H01L 31/02008
136/244
4,710,588 A 12/1987 Ellion
(Continued)

OTHER PUBLICATIONS

Najafi, Hamidreza; Woodbury, Keith A.; "Optimization of a cooling system based on Peltier effect for photovoltaic cells"; Solar Energy 91 (2013) pp. 152-160. (Year: 2013).*

*Primary Examiner* — Tamir Ayad
(74) *Attorney, Agent, or Firm* — Neil Jetter; Jetter & Associates, P.A.

(57) ABSTRACT

A hybrid solar cell includes a photovoltaic (PV) cell having an upper grid and lower contact plate with an anode and cathode region in between. A thermoelectric (TE) cell has a top and bottom segmented connector layer with TE elements having pairs of n-doped elements and p-doped elements connected together electrically in series and thermally in parallel by segments of the top or bottom segmented connector layer. An electrically insulating and thermally conducting layer is between the plate and the TE cell. A direct electrical connection is between the cathode region provided by the upper grid or lower plate and segments contacting the n-doped elements, and a direct electrical connection is between the anode region provided by the grid or plate and segments contacting the p-doped elements for the PV cell to power the TE cell and the TE cell to provide active cooling for the PV cell.

17 Claims, 5 Drawing Sheets

(51) Int. Cl.
*H01L 31/048* (2014.01)
*H02S 40/32* (2014.01)
*H01L 31/024* (2014.01)
*H02S 40/42* (2014.01)
*H01L 31/052* (2014.01)
*H02S 10/10* (2014.01)
*H02S 40/12* (2014.01)
*H01L 31/054* (2014.01)

(52) U.S. Cl.
CPC .......... *H01L 31/048* (2013.01); *H01L 31/052* (2013.01); *H01L 31/0547* (2014.12); *H02S 10/10* (2014.12); *H02S 40/12* (2014.12); *H02S 40/32* (2014.12); *H02S 40/42* (2014.12); *Y02E 10/50* (2013.01)

(56) References Cited

U.S. PATENT DOCUMENTS

| | | | |
|---|---|---|---|
| 4,773,945 A | 9/1988 | Woolf et al. | |
| 5,409,550 A | 4/1995 | Safir | |
| 5,987,891 A | 11/1999 | Kim et al. | |
| 8,008,573 B2 * | 8/2011 | Dai | H01L 35/30 136/206 |
| 8,058,547 B1 * | 11/2011 | Casperson | G02B 5/045 136/244 |
| 8,232,625 B2 | 7/2012 | Voldman | |
| 8,969,717 B2 * | 3/2015 | Sager | H02S 10/10 136/259 |
| 2003/0038610 A1 | 2/2003 | Munshi et al. | |
| 2003/0221717 A1 | 12/2003 | Dessel | |
| 2006/0125114 A1 | 6/2006 | Ruben | |
| 2007/0137685 A1 * | 6/2007 | Jwo | A42B 3/285 136/203 |
| 2007/0253167 A1 * | 11/2007 | Chiang | B60H 1/00478 361/717 |
| 2007/0290287 A1 | 12/2007 | Freedman | |
| 2008/0155991 A1 * | 7/2008 | Lee | A42B 3/285 62/3.2 |
| 2009/0289381 A1 * | 11/2009 | Burmeister | B29C 44/1266 264/1.1 |
| 2010/0043871 A1 * | 2/2010 | Xia | H01L 31/0488 136/251 |
| 2013/0000725 A1 * | 1/2013 | Oliver | B32B 17/10761 136/259 |
| 2013/0291919 A1 * | 11/2013 | Lu | H01L 31/0547 136/201 |

* cited by examiner

HYBRID SOLAR CELL

FIELD

This Disclosure relates to solar cells and, in particular, to hybrid solar cells that include photovoltaic cells and thermoelectric cells.

BACKGROUND

Semiconductor solar cells are utilized to convert light energy to useable electrical power through the photovoltaic effect. Briefly, a typical semiconductor solar cell includes an interface between n-type and p-type transparent semiconductor materials. Light shining on the semiconductor materials adjacent to the interface creates hole-electron pairs in addition to those otherwise present, and the minority charge carriers migrate across the interface in opposite directions. There is no compensating flow of majority carriers, so that a net electrical charge results. A useful electrical current is then obtained in an external electrical circuit by forming ohmic contacts to the p-type and n-type materials on either side of the interface.

In general terms, a photovoltaic solar cell (or PV cell) is fabricated by depositing or attaching the appropriate semiconductor layers in the form of a typically thin wafer onto a supporting substrate, and then adding additional components to complete the cell. The individual PV cells are electrically connected together in parallel into large arrays to deliver power of the desired voltage and current. The ratio of power output to area of the solar cell array is an important design parameter, since the required power output could in principle be satisfied, for example, by larger numbers of low power density PV cells made of silicon or by smaller numbers of high power density solar cells made of gallium arsenide. Large numbers of PV cells require more supporting structure and area with solar access (such as the scarce area on rooftops) adding cost and complexity to PV system, and reducing the amount of energy which can be generated on a given site, such as a building or plot of land.

A number of the individual PV cells are generally connected together in an array, typically by fastening the PV cells to a support structure and then electrically interconnecting the cells into series and parallel arrangements, as necessary to meet the power requirements. This incentive for improved power output and area reduction is particularly pressing for crystalline PV cells such as mono-crystalline silicone solar cells, which have higher power output per unit area than thin-film PV cells, but continue to be at a disadvantage in cost per unit area, mainly because of their manufacturing requirements.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize the power output for most photovoltaic (PV) (or solar) cells decreases significantly with increased cell temperature, with about a 0.4% to 0.5% loss for every degree Celsius (° C.). This drop in output power is mainly due to the characteristic open circuit PV cell voltage, which decreases by about 0.4%/° C. due to increased recombination in the semiconductor (e.g., silicon) stemming from the greater prevalence of phonons (lattice vibrations) at higher temperatures. Under standard conditions of one sun being 1,000 W/m² of solar illumination, a typical PV cell operating temperature may increase 30° C. to 40° C., so that this negative effect can cause a significant power loss of about 15% to 20%. Nearly every negative mechanism (oxidation, delamination, encapsulation failure) for PV cells is accelerated by high temperatures, sometimes exponentially with temperature.

Disclosed embodiments include a hybrid solar cell (hybrid cell) including a PV cell having an upper grid and lower contact plate which typically provides the structural substrate for the PV cell. The upper grid allows light to pass through relatively unobstructed. The PV cell has an n-type anode region and a p-type cathode region between the upper grid and lower contact plate. A thermoelectric (TE) cell has a top segmented connector layer and bottom segmented connector layer with TE elements having pairs of n-doped elements and p-doped elements connected together electrically in series and thermally in parallel by segments of the top and/or bottom segmented connector layer.

An electrically insulating and thermally conducting layer is between the lower contact plate and the TE cell. A first direct electrical connection is between the cathode region provided by the upper grid or lower plate and segments contacting the n-doped elements, and a second direct electrical connection is between the anode region provided by the other of the upper grid and lower plate and segments contacting the p-doped elements for the PV cell to power the TE cell and for the TE cell to provide active cooling for the PV cell.

BRIEF DESCRIPTION OF THE DRAWINGS

Reference will now be made to the accompanying drawings, which are not necessarily drawn to scale, wherein.

Reference will now be made to the accompanying drawings, which are not necessarily drawn to scale, wherein.

DETAILED DESCRIPTION

Before explaining the disclosed embodiments in detail it is to be understood that disclosed embodiments are not limited in its application to the details of the particular arrangements shown. Also, the terminology used herein is for the purpose of description and not of limitation.

Figure 1A:
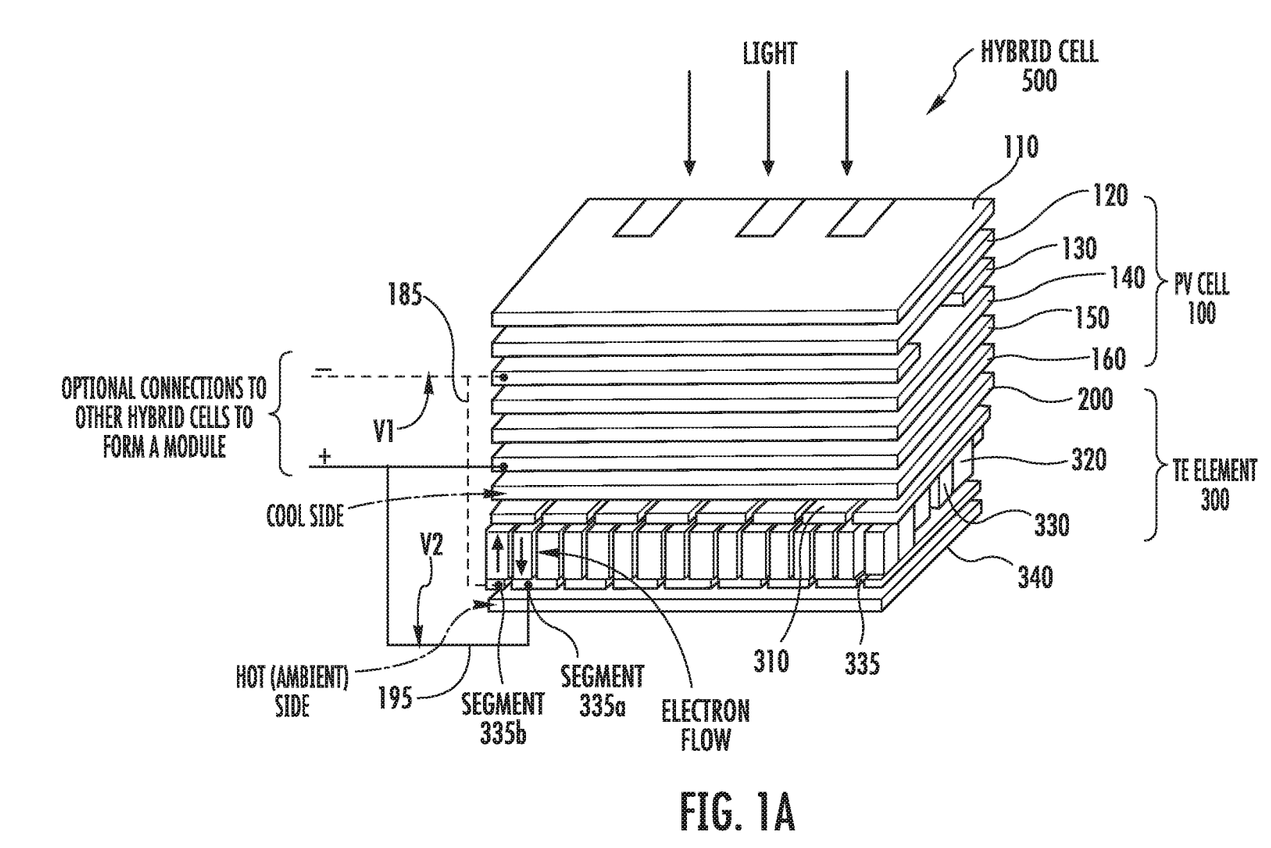
FIG. 1A is a schematic of an example hybrid cell including a PV cell and TE cell having electrical connections so that the PV cell powers the TE cell and the TE cell provides active cooling for the PV cell, according to an example embodiment.

Disclosed embodiments provide a unique application of PV and TE cells to form a hybrid cell having increased efficiency and longevity, where the PV cell is directly electrically connected to power the TE cell and for the TE cell to provide active cooling for the PV cell. FIG. 1 is a schematic of an example hybrid cell 500 hard wired to automatically implement the above-described mode of operation. No controller is present in FIG. 1 nor is needed to implement the above-described mode of operation.

As shown, hybrid cell 500 includes a PV cell 100 and TE cell 300 with an electrically insulating and thermally conducting layer 200 being the only layer in between that has a thickness typically 1 mm to 5 mm so that the cold side of the TE cell 300 is only about 1 to 5 mm way from the PV cell 100. The PV cell 100 includes a silicon wafer having p-type cathode region (p-type silicon layer) 150 and n-type anode region (n-type silicon layer) 140. Although not shown, an intrinsic (undoped) layer can be positioned between the p-type cathode region 150 and n-type anode region 140 on the silicon wafer.

The PV cell 100 includes an upper contact grid (upper grid) 130 and a lower contact plate 160, with the n-type anode region 140 and a p-type cathode region 150 between the upper grid 130 and lower contact plate 160. The upper grid 130 allows light to reach the n-type anode region 140. The lower contact plate 160 besides providing the electrical contact function also provides the structural function of a substrate for the PV cell 100.

The TE cell 300 is shown sandwiched at its top side by the electrically insulating and thermally conductive layer 200 and on its bottom side by a bottom electrically insulating layer 340. Electrically insulating but thermally conductive layer 200 can comprise a thin dielectric material having a high dielectric strength per unit thickness, such as a polyimide. The n-type elements 320 and p-type elements 330 are between segmented top electrical connectors 310 and segmented bottom electrical connectors 335. The segmented top electrical connectors 310 and segmented bottom electrical connectors 335 of the TE 300 are not a single plane of metal (e.g., copper), but rather comprise a plurality of segments which connect to the p-type elements 330 and to the n-type elements 320, configured so that pairs of n-type elements 320 and p-type elements 330 are connected together electrically in series, and thermally in parallel. Segmented bottom electrical connectors 335 is shown including segment 335a and segment 335b. Segment 335a is shown connected to the n-type elements 320 and segment 335b is shown connected to p-type elements 330.

Hybrid cell 500 includes a first direct electrical connection 195 and a second direct electrical connection 185. The first direct electrical connection 195 provides a metal connection between the p-type cathode region 150 of the PV cell 100 provided by the lower contact plate 160 and one of the segments including segment 335a contacting the n-doped elements 320 of the TE cell 300. As noted above, the lower contact plate 160 provides both an electrical function as a contact plate and a structure function as a substrate including support of the PV wafer of the PV cell 100. Second direct electrical connection 185 provides a metal connection between the n-type anode region 140 of the PV cell provided by the upper grid 130 and others of the segments including segment 335b connected to the p-type elements 330.

Figure 1B:
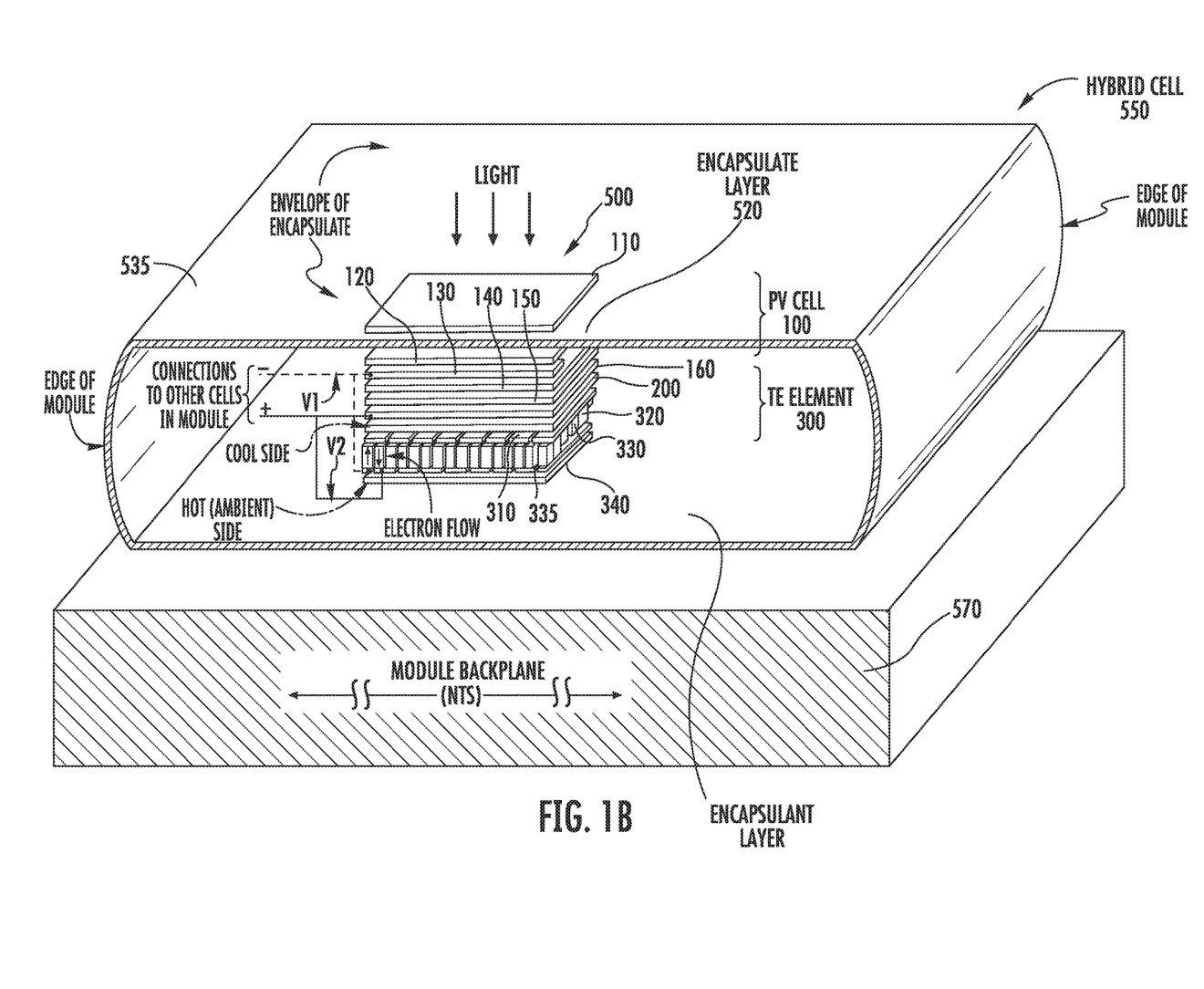
FIG. 1B is a schematic of an example hybrid cell including a PV cell and TE cell having electrical connections so that the PV cell powers the TE cell and the TE cell provides active cooling for the PV cell, including an encapsulant envelope around the entire hybrid cell, according to an example embodiment.

FIG. 1B is a schematic of an example hybrid cell 550 including a PV cell 100 and TE cell 300 having electrical connections so that the PV cell powers the TE cell and the TE cell provides active cooling for the PV cell, including an encapsulant layer 520 over the AR layer 120 of the PV cell and another encapsulant layer 525 on the bottom electrically insulating layer 340 on the bottom side of the TE cell 300, as well as an encapsulant envelope 535 around the whole hybrid cell 550 which is shown mounted on a backplane 570, according to an example embodiment. The "NTS" shown on backplane 570 indicates Not To Scale as the horizontal dimension of the backplane 570 is generally at least 2 orders of magnitude greater than its vertical dimension. The encapsulant for the encapsulant envelope 535 comprises an optically transparent material such as ethylene vinyl acetate (EVA), but other optically transparent polymers are possible for the encapsulant. The encapsulant layer 520 and encapsulant layer 525 need not be optically transparent, but can be optically transparent as well, such as encapsulant envelope 535, encapsulant layer 520 and encapsulant layer 525 all comprising EVA.

In regard to assembly of disclosed hybrid cell(s) 500, the TE 300 cell can be 3D printed (using inks, one ink for the n-type elements 320 and another ink for the p-type elements 330, and conducting metal-particle inks for the connecting segments) or otherwise deposited on the electrically insulating and thermally conducting layer 200 which is immediately adjacent the lower contact plate 160 which acts as the substrate of the PV cell 100. The TE cell 300 is thus directly bonded to the PV cell's substrate, save a thin electrically insulating and thermally conductive layer 200 that is typically 25 to 100 μms (1 to 4 mils) thick so that the cold side of the TE cell is only about 25 to 100 μms away from the PV cell.

There are a variety of methods for forming the direct electrical connection 185 and 195. One method utilizes an electrically conducting paste or solder, deposited through a hole (or aperture) in the electrically insulating and thermally conductive layer 200 which is located to allow electrical contact between the one of the grid 130 and contact plate 160 of the PV cell 100 and an appropriate point on the segmented top or bottom electrical connectors (310 or 335). Another method is to bring direct electrical connections out as wires out from the edge of the PV cell 100 and around over the edge of the electrically insulating and thermally conductive layer 200 to reach appropriate points on one or the other of the segmented connection layers.

The hybrid cell 550 can be encapsulated together in a single manufacturing pass, rather than conventionally pasting a TE cell on the back of a finished PV cell which is itself fully encapsulated. The TE cell 300 and the PV cell 100 can both be within one common outer encapsulant envelope comprising a polymer such as EVA. The array of hybrid cells 500 can further comprise a module backplane 570 shown in FIG. 1B described wherein the module backplane 570 comprises a rigid sheet that is external to the TE cell 300 and to the PV cell 100, and the encapsulation thereof. As described above, the resulting close proximity positioning with a thermally conductive material between the PV cell 100 and TE cell 300 results in the transfer of heat away from the active silicon of the PV cell 100 to cool highly efficiently because the PV cell 100 is generally only a few millimeters (e.g., 1 to 5 mm) from the cold side of the TE cell 300 (the thickness of electrically insulating and thermally conducting layer 200). In contrast in conventional art, cooling of the environment around the PV cell is where most of the cooling happens the PV cell is cooled, since as described above the PV cell is conventionally itself encapsulated with a thermally insulating material such as a thermally insulating polymer, and is mounted on a thermally insulating polymer backplane for structural rigidity.

Except for use in indoor laboratory experiments, the semiconductor material (typically silicon wafers for any PV cell must generally be encapsulated by a transparent polymer as an impervious layer to protect the wafer material from moisture and contaminants, and to prevent oxidation or other reactions with the environment. Unlike any known arrangements purporting to cool the PV cell 100 with a TE element 300, disclosed hybrid cells 500 and 550 allows the TE cell 300 to be printed or deposited essentially directly (only intervening thickness of electrically insulating and thermally conducting layer 200) on the lower plate 160 acting as a substrate of the PV cell using 3-D printing techniques or other depositing processes compatible with, and included in, the manufacturing flow of the PV cell 100 itself.

The encapsulant envelope 535 of the hybrid cell 550 serves a dual-function, to protect both the wafer of the PV cell 100 and the TE segments of the TE cell 300 together as a single combined hybrid cell device. A second advantage of including the TE cell 300 within the encapsulant envelope 535 with the PV cell 100 becomes clear when recognizing that the polymer encapsulate is a thermal insulator which would inhibit the cooling performance of the TE cell 300 were it to be outside the encapsulant, and even worse cooling performance if the TE cell 300 is within a dedicated encapsulant of its own.

Further, disclosed hybrid cells allow the necessary structural backplane of the assembly of the PV cell 100 to also serve as the structural backplane of the TE cell 300. The crystalline semiconductor wafer of a PV cell 100 are generally thin (to provide high conversion efficiency may be 100 µm thick, or less) and brittle, generally needing a structural backplane so they can be assembled into a larger array, or module. The backplane is typically a polymer material of sufficient thickness to present significant thermal resistance to dissipation of the heat energy arising in the active semiconductor of the PV cell 100. Therefore, a known stand-alone TE cell placed on the outside of the backplane of the PV cell 100 after manufacture of the PV module is not capable of cooling the PV wafer without significant electrical energy expense, rendering the TE cooler essentially economically useless.

During operation of the PV cell 100 of the disclosed hybrid cells, sunlight passing through the glass 110 and AR layer 120 directly below the glass layer 110 eventually strikes both sides of the pn junction including the n-type silicon layer 140 releasing holes and the p-type silicon layer 150 releasing free electrons. The electrons from the p-type silicon layer 150 are attracted to the positively-charged n-type silicon layer 140. Connecting the PV cell 100 to other optional PV cells in series enables the voltage of each PV cell to add up to power a desired external load that requires a voltage greater than the voltage generated by a single PV cell 100.

During operation of hybrid cells 500 and 550, when the DC voltage shown as $V_1$ in FIGS. 1A and 1B of the proper polarity (−) is applied by top grid 130 (from n-type anode region 140 of the PV cell) via direct electrical connection 185 as an input to segments including segment 335b connected to the p-type elements 330, and a DC voltage shown as $V_2$ in FIG. 1 of the proper polarity (+) is applied by contact plate 160 (from p-type cathode region 150 of the PV cell) via direct electrical connection 195 as an input to segments including segment 335a connected to the n-type elements 320, the n-type elements 320 and p-type elements 330 absorb heat energy from the electrically insulating layer and thermally conducting layer 200 and release it to the bottom electrically insulating layer 340 at the opposite side of the TE cell 300. The surface of the TE cell 300 where heat energy is absorbed becomes cold which cools the PV cell 100, and the opposite surface of the TE cell 300 where heat energy is released becomes hotter. Electron flows are as shown by the arrows within one of the n-type elements 320 and one of the p-type elements 330.

This disclosed mode of operation uses the TE cell 300 as a Peltier Effect cooler, automatically driven by the DC output of the PV cell 100 system to cool the PV cell to increase the output power of the PV cell 100 under typically hot conditions. As noted above, PV cells suffer a significant decline in output voltage, and therefore in generated power and energy, with increase in cell temperature. For example, crystalline silicon PV cells decline approximately 0.5% in output power for every degree Centigrade increase in cell temperature. Even in cool weather, a PV cell typically runs at 50 to 70° C. during the full sun that often occurs in the middle of the day. Preliminary analysis of one representative combination yields a net increase of approximately 10% in total output power of hybrid solar cell, the total output power being the net of the power driving the TE cell 300 and the output of the PV cell 100

Figure 2:
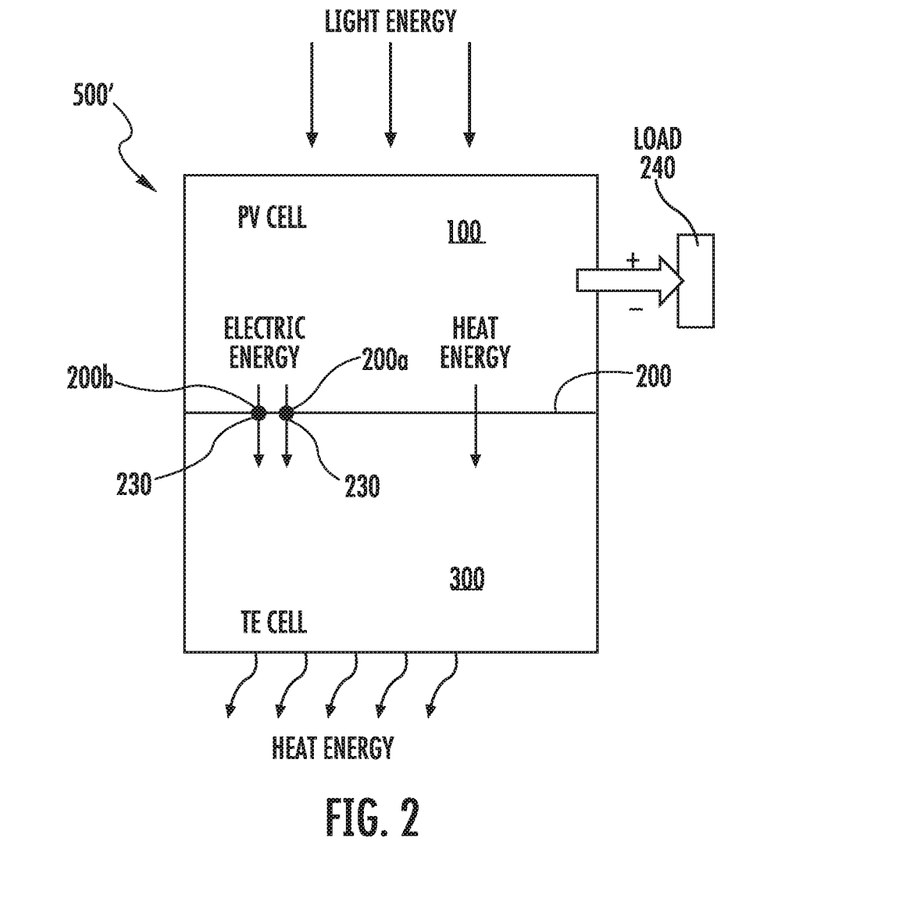
FIG. 2 is an energy flow diagram showing an array of PV cells and TE cells combined as hybrid module, according to an example embodiment.

FIG. 2 is an energy flow diagram of an example of a hybrid cell 500'. The hybrid cell includes appropriate electrical connections between the PV cell 100 and TE cell 300 shown utilizing an electrically conducting material 230 such as an electrically conducting paste or solder within the apertures 200a and 200b formed in the electrically insulating and thermally conducting layer 200. The hybrid cell 500' receives electric energy directly, internally and exclusively from the PV cell 100, extracts heat directly and internally from the PV cell 100, and the PV cell automatically delivers electric energy not consumed by the TE cell 300 to an external load 240 as useful DC electric energy.

Figure 3:
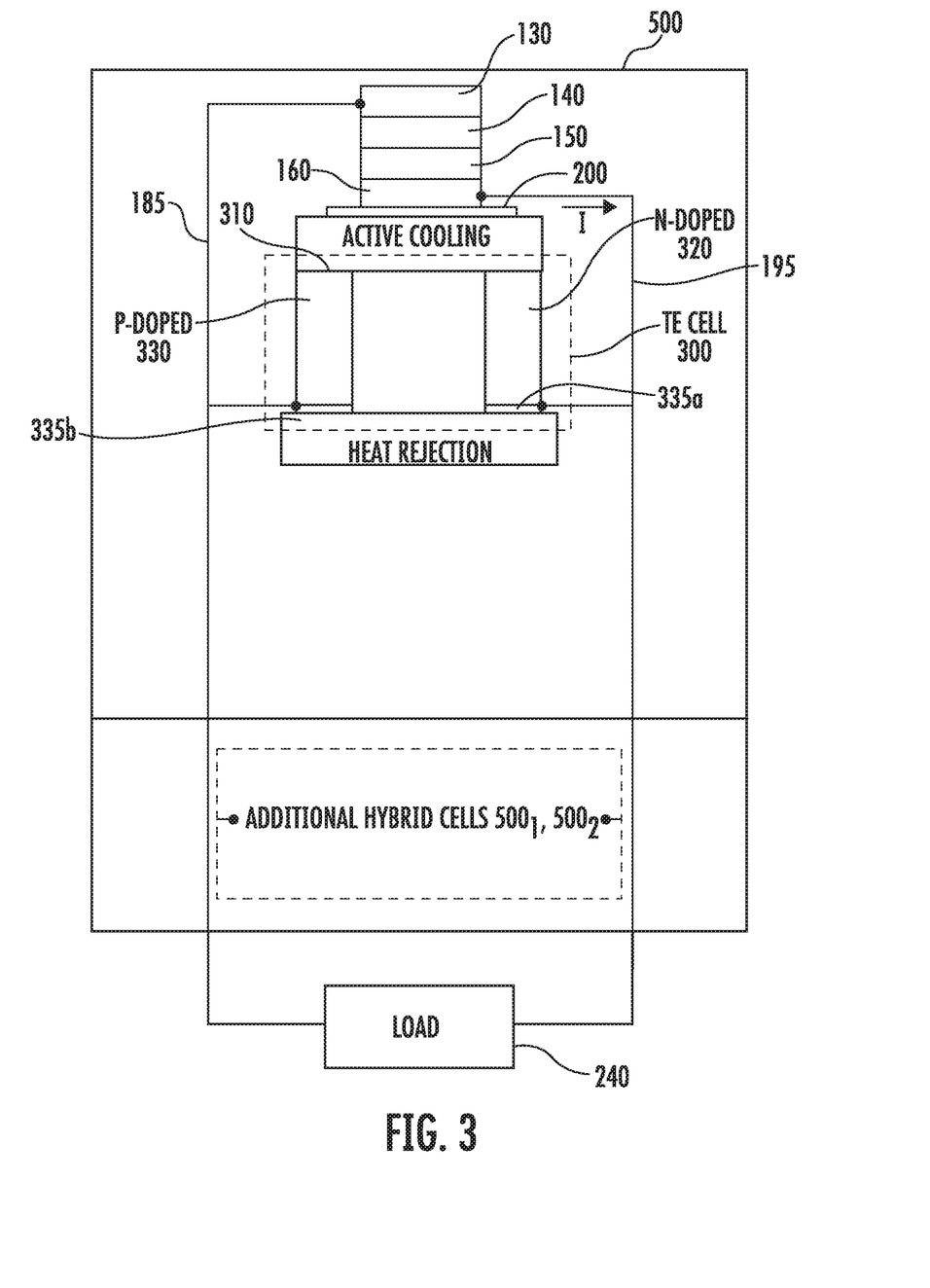
FIG. 3 is a simplified diagram of an example array of hybrid cells each having a TE cell having first and second direct electrical connections between the cathode region of the PV cell and the n-doped elements of the TE cell and between the anode region of the PV cell and the p-doped elements of the TE cell, where the PV cell provides power to the TE cell and the TE cell provides active cooling for the PV cell.

FIG. 3 is a simplified diagram of an example array of hybrid solar cells 500 with each hybrid cell having a TE cell with a direct electrical connections between the cathode region 150 of the PV cell 100 provided by the upper grid 130 or lower contact plate 160 and the n-doped elements 320 of the TE cell 300 between the anode region 140 of the PV cell 100 provided by the other of the upper grid 130 and lower contact plate 160 and the p-doped elements 330 of the TE cell 300 for the PV cell 100 to power the TE cell 300 and for the TE cell 300 to provide active cooling for the PV cell 100. This figure shows how the respective hybrid cell fits into an array of hybrid cells, and also shows the array of hybrid solar cells 500 driving an external load 240. As used herein, a direct electrical connection requires a low resistance coupling path between the respective elements/devices, typically a metal-to-metal connection with the possibility of an intervening metal (or heavily doped semiconductor) link or layer in the coupling path.

Application of disclosed techniques is expected to increase net PV cell conversion efficiency by 8% to 10%, based on preliminary calculations of constructions of PV/TE combinations under average ambient conditions without optimization of materials and construction. With some changes to the materials and construction (e.g., selection of the TE materials and the p and n doping specifically for the expected ambient temperatures of the installation location), the expected net conversion efficiency can increase to reach about 15%. Major efforts and millions of dollars are going to the effort to improve PV cell efficiency by just a few percent. Even though the overall improvement in efficiency is net of any energy required to drive the TE cell 300, disclosed techniques can bring an average improvement in PV system output of 10%. If the resulting designs are found to be economic (less than approximately 10% more capital in this example), and practical, the work could bring a significant drop in PV system installation costs per kW and delivered energy costs (in cents/kWh).

Furthermore, the single greatest contributor to the physical end-of-life for any PV cell is prolonged operation at these high temperatures and cycling between cool and hot temperatures. Most negative mechanisms including oxidation, delamination and encapsulation failure, are accelerated by high temperatures, exponentially in some cases. Operation in this mode greatly reduces the temperature of the PV cell itself, and thereby minimizes extremes of thermal cycling.

Figure 4:
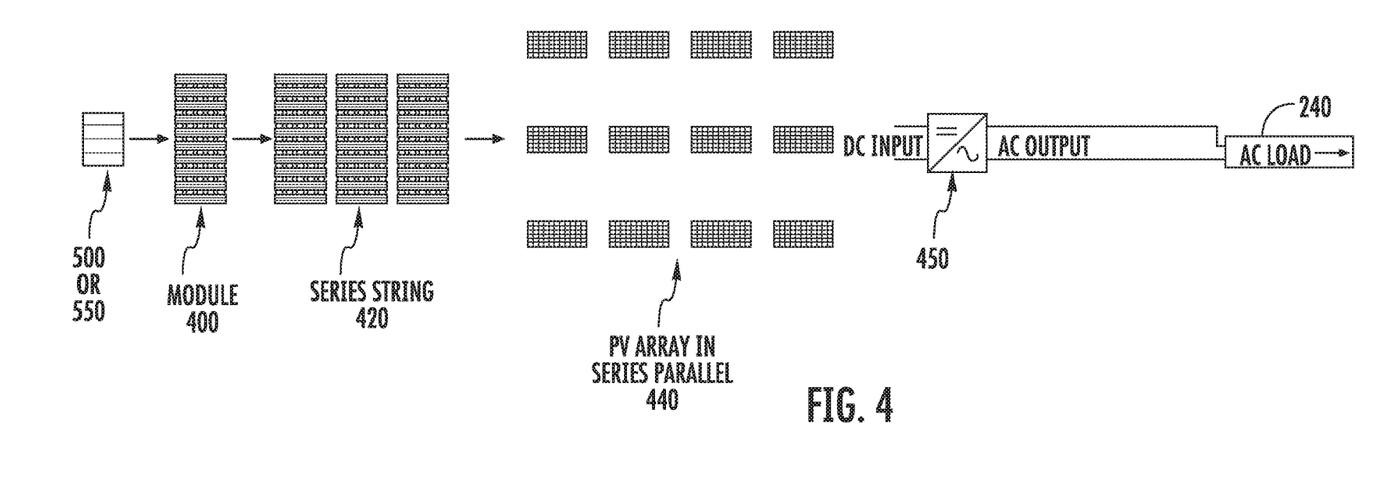
FIG. 4 shows a plurality of disclosed hybrid cells configured into a typical PV electrical generator system.

FIG. 4 shows a plurality of disclosed hybrid cells configured into a typical PV electrical generator system. Hybrid cells 500 or 550 are integrated into a hybrid module 400 as typically 60 to 128 hybrid cells electrically in series. Typical hybrid cells have a size between 125 mm and 152 mm square. At any point after assembly into a hybrid module, a DC LOAD can be served. A plurality of hybrid modules 400 are typically integrated into a series string 420 being typically 2 to 15 hybrid modules electrically in series. Series strings 420 are typically integrated into an array 440 as typically 2 to over 300 strings electrically in parallel. The DC output from array 440 is typically fed into an inverter 450 for conversion into AC power. At any point after the inverter 450 an AC LOAD can be served. The AC output of the inverter 450 is typically fed into a building electrical system with load 240 shown in FIG. 4. There are many choices for configuration, such as a microinverter as the inverter 450 on each hybrid module 400 to 2 MW inverters large arrays. The load 240 serviced can be to a building, or to a substation, such as a 200 MW substation.

In assembly, a plurality of hybrid cells 500 or 550 are arranged into the module configuration, for example 6 columns and 12 rows, then "tabbed" (soldered) together in series. This can be performed by laying on a sheet of an optically transparent polymer film such as an EVA film, which is laying on the module backplane, such as module backplane 570 shown in FIG. 1B. Then the top layer of EVA film is placed over the assembly (over AR layer 120), and heat is applied to melt the edges of the EVA films together, forming an encapsulant envelope around the cells to be assembled into the module 400.

In summary, disclosed embodiments provide hybrid cells and modules therefrom integrating PV and TE cells. The TE cell 300 is used to automatically cool the PV cell 100 directly, without intervening layers of structural backing material or encapsulation, effectively increasing the PV cell performance in real-world conditions. Disclosed operation of the TE cell configured as a Peltier Effect cooler driven automatically and exclusively by the DC output of the PV system to cool the PV cell elements will significantly increase the net output power of the hybrid cell under typically hot conditions.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The invention claimed is:

1. A hybrid solar cell (hybrid cell) comprising:
a photovoltaic (PV) cell having an upper grid and a lower contact plate with an n-type anode region (anode region) and a p-type cathode region (cathode region) between the upper grid and the lower contact plate;
a thermoelectric (TE) cell having a top segmented connector layer and a bottom segmented connector layer with TE elements including a plurality of n-doped elements and a plurality of p-doped elements with pairs of the n-doped elements and p-doped elements connected together electrically in series and thermally in parallel by at least one segment of the top segmented connector layer and at least one segment of the bottom segmented connector layer,
an electrically insulating and thermally conducting layer between the lower contact plate and the TE cell, and
the PV cell and TE cell electrically connected in parallel with a first direct electrical connection between the cathode region of the PV cell provided by the upper grid or the lower contact plate and one of the at least one segment connected to one of the n-doped elements of the TE cell and a second direct electrical connection between the anode region of the PV cell provided by the other of the upper grid and the lower contact plate and another of the at least one segment connected to one of the p-doped elements of the TE cell for the PV cell to provide DC power to power the TE cell and for the TE cell to provide active cooling for the PV cell.

2. The hybrid cell of claim 1, wherein the electrically insulating and thermally conducting layer is directly on the lower contact plate.

3. The hybrid cell of claim 1, further comprising a bottom electrically insulating layer directly on the bottom segmented connector layer, the bottom electrically insulating layer providing an exposed bottom surface for the hybrid cell.

4. The hybrid cell of claim 1, wherein the electrically insulating and thermally conducting layer spans a full distance without any intervening layer(s).

5. The hybrid cell of claim 1, wherein the electrically insulating and thermally conducting layer includes apertures and filled with an electrically conducting material to provide the first direct electrical connection and the second direct electrical connection.

6. The hybrid cell of claim 1, wherein the TE cell and the PV cell are both within a common outer encapsulant envelope comprising an optically transparent polymer to provide an encapsulated hybrid cell.

7. The hybrid cell of claim 6, wherein the first direct electrical connection and the second direct electrical connection are disposed on sidewalls of the hybrid cell within the encapsulant envelope.

8. The hybrid cell of claim 6, further comprising a backplane below and in contact with the encapsulated hybrid cell.

9. A solar system, comprising:
a plurality of hybrid solar cells (hybrid cells), each of the hybrid cells comprising:

a photovoltaic (PV) cell having an upper grid and a lower contact plate with an n-type anode region (anode region) and a p-type cathode region (cathode region) between the upper grid and the lower contact plate;

a thermoelectric (TE) cell having a top segmented connector layer and a bottom segmented connector layer with TE elements including a plurality of n-doped elements and a plurality of p-doped elements with pairs of the n-doped elements and p-doped elements connected together electrically in series and thermally in parallel by at least one segment of the top segmented connector layer and at least one segment of the bottom segmented connector layer;

an electrically insulating and thermally conducting layer between the lower contact plate and the TE cell;

the PV cell and TE cell electrically connected in parallel with a first direct electrical connection between the cathode region of the PV cell provided by the upper grid or the lower contact plate and one of the at least one segment connected to one of the n-doped elements of the TE cell and a second direct electrical connection between the anode region of the PV cell provided by the other of the upper grid and the lower contact plate and another of the at least one segment connected to one of the p-doped elements of the TE cell for the PV cell to provide DC power to power the TE cell and for the TE cell to provide active cooling for the PV cell.

10. The solar system of claim 9, wherein the solar system is exclusive of a controller.

11. The solar system of claim 9, wherein the electrically insulating and thermally conducting layer is directly on the lower contact plate.

12. The solar system of claim 9, further comprising a bottom electrically insulating layer directly on the bottom segmented connector layer, the bottom electrically insulating layer providing an exposed bottom surface for the hybrid cells.

13. The solar system of claim 9, wherein the electrically insulating and thermally conducting layer includes apertures and filled with an electrically conducting material to provide the first direct electrical connection and the second direct electrical connection.

14. The solar system of claim 9, wherein the TE cell and the PV cell are both within one common outer encapsulant envelope comprising an optically transparent polymer to provide an encapsulated hybrid cell.

15. The solar system of claim 14, wherein the first direct electrical connection and the second direct electrical connection are disposed on sidewalls of the hybrid cells within the encapsulant envelope.

16. The solar system of claim 14, further comprising a backplane below and in contact with the encapsulated hybrid cell.

17. The solar system of claim 9, wherein the hybrid cells are connected electrically in series to provide a solar module, further comprising a plurality of the solar modules connected together as a series string, further comprising an output of the series string coupled to an input of an inverter for conversion of a DC power output by the series string to AC power.

* * * * *